United States Patent
Kedo et al.

(10) Patent No.: US 6,219,936 B1
(45) Date of Patent: Apr. 24, 2001

(54) WAFER DRYING DEVICE AND METHOD

(75) Inventors: Yutaka Kedo, Plano, TX (US); Yoshio Takemura, Nara; Susumu Matsuda, Yao, both of (JP)

(73) Assignee: Toho Kasei Co., Ltd., Nara-Ken (JP)

( * ) Notice: Subject to any disclaimer, the term of this patent is extended or adjusted under 35 U.S.C. 154(b) by 0 days.

(21) Appl. No.: 09/447,219

(22) Filed: Nov. 23, 1999

(30) Foreign Application Priority Data

Nov. 24, 1998 (JP) .................................................. 10-332545

(51) Int. Cl.[7] ........................................................ F26B 7/00
(52) U.S. Cl. ................................. 34/381; 34/404; 34/405; 34/76; 34/79; 34/202; 34/221
(58) Field of Search .............................. 34/340, 342, 401, 34/402, 404, 405, 406, 61, 76, 77, 78, 79, 202, 221, 364, 370, 381; 134/26, 30, 31, 95.2, 95.3, 902

(56) References Cited

U.S. PATENT DOCUMENTS

| | | |
|---|---|---|
| 5,653,045 | 8/1997 | Ferrell . |
| 5,685,086 | 11/1997 | Ferrell . |
| 5,709,037 * | 1/1998 | Tanaka et al. ........................ 34/330 |
| 5,782,990 * | 7/1998 | Murakami et al. ..................... 134/26 |
| 5,950,328 * | 9/1999 | Ichiko et al. ........................... 34/364 |
| 5,956,859 * | 9/1999 | Matsumoto et al. ..................... 34/74 |
| 5,964,958 | 10/1999 | Ferrell et al. . |
| 5,968,285 | 10/1999 | Ferrell et al. . |
| 6,032,382 * | 3/2000 | Matsumoto et al. ..................... 34/78 |
| 6,068,002 * | 5/2000 | Kamikawa et al. ............. 134/902 X |

FOREIGN PATENT DOCUMENTS 6-103686    12/1994    (JP) .

* cited by examiner

Primary Examiner—Stephen Gravini
(74) Attorney, Agent, or Firm—Wenderoth, Lind & Ponack, L.L.P.

(57) ABSTRACT

Nitrogen gas is jetted into a space on the liquid level of pure water in a drying chamber in which wafers are immersed. Simultaneously therewith, liquid-phase isopropyl alcohol is jetted at a temperature higher than the temperature of the wafers and in the vicinity of jetting openings for the nitrogen gas. When the wafers are exposed above the liquid level in the drying chamber, the pure water held on both front and rear surfaces of the wafers is replaced by the isopropyl alcohol of mist-form. The isopropyl alcohol is then evaporated, whereby the wafers are dried.

16 Claims, 4 Drawing Sheets

WAFER DRYING DEVICE AND METHOD

BACKGROUND OF THE INVENTION

The present invention relates to a wafer drying apparatus and method for drying the surface of the wafer immersed in pure water without causing the wafer to contact oxygen when the wafer is taken out from the pure water.

Conventionally, as in a drying apparatus disclosed in Japanese Patent Publication No. 6-103686, with nitrogen gas used as a carrier, IPA (isopropyl alcohol) is supplied in the form of vapor into an upper space in a wafer treating bath which contains a wafer treated with an etching liquid and cleaned with pure water. Then, the pure water in the treating bath is drained so that the wafer is exposed in the treating bath, whereby the IPA vapor supplied to the upper space of the treating bath is replaced with water drops held to the surface of the wafer, and so that the surface of the wafer is enabled to dry without naturally oxidizing due to contact with oxygen.

With an apparatus of the above mentioned construction, however, usually an IPA vapor of an ordinary temperature, equal to the wafer temperature that is an ordinary temperature, is supplied into the treating bath for replacement, and this involves long drying time from the evaporation of the IPA of the ordinary temperature to the drying of the wafer surface, which poses an issue of poor drying efficiency.

SUMMARY OF THE INVENTION

Therefore, the present invention is intended to solve the above mentioned issue. To this end the object of the present invention is to provide a wafer drying apparatus and method which enable fast drying of mist-form IPA from the surface of a wafer at a higher temperature than the temperature of the wafer, thereby to reduce the amount of time required for drying by replacing water drops held to the surface of the wafer by the mist-form IPA, thus enhancing drying efficiency.

In order to accomplish the above mentioned object, the present invention has the following constructions.

According to a first aspect of the present invention, there is provided a wafer drying apparatus comprising: a drying chamber capable of immersing a wafer in pure water; and a mist spraying device for jetting nitrogen gas into a space on a liquid level of the pure water in the drying chamber and, simultaneously therewith, injecting isopropyl alcohol of liquid-phase into the space at a temperature higher than a temperature of the wafer and in the vicinity of an opening for jetting the nitrogen gas, thus spraying isopropyl alcohol of mist-form in the space. When the wafer is exposed above from the liquid level of the pure water in the drying chamber by discharging the pure water in the drying chamber from the drying chamber or elevating the wafer in the drying chamber, the pure water held on the front and rear surfaces of the wafer is replaced by the isopropyl alcohol of mist-form. Then the isopropyl alcohol is evaporated from the front and rear surfaces of the wafer whereby the wafer is dried.

According to a second aspect of the present invention, there is provided a wafer drying apparatus as defined in the first aspect, wherein the isopropyl alcohol of the liquid phase is injected at a temperature higher by at least 5° C. or more than the temperature of the wafer in the vicinity of the nitrogen gas injection opening so that the isopropyl alcohol of mist-form is sprayed into the space.

According to a third aspect of the present invention, there is provided a wafer drying apparatus as defined in the first or second a spect, wherein the wafer is of an ordinary temperature and the temperature of the mist is of generally not less than 30° C.

According to a fourth aspect of the present invention, there is provided a wafer drying apparatus as defined in any one of the first through third aspects, wherein the isopropyl alcohol of mist-form is of such a state that the isopropyl alcohol per se is suspended alone in the nitrogen gas.

According to a fifth aspect of the present invention, there is provided a wafer drying apparatus as defined in any one of the first through fourth aspects, wherein the isopropyl alcohol is sprayed in mist-form at a temperature 5° to 60° C. higher than the temperature of the wafer.

According to a sixth aspect of the present invention, there is provided a wafer drying method comprising: immersing a wafer in pure water in a drying chamber; jetting nitrogen gas into a space at a liquid level of the pure water in the drying chamber, and simultaneously thereupon spraying isopropyl alcohol of liquid phase at a temperature higher than a temperature of the wafer and in the vicinity of an opening for jetting the nitrogen gas, thus spraying isopropyl alcohol of mist-form in the space. When the wafer is exposed above from the liquid level of the pure water in the drying chamber by discharging the pure water in the drying chamber from the drying chamber or elevating the wafer in the drying chamber, the pure water held on front and rear surfaces of the wafer is replaced by the isopropyl alcohol of mist-form. Then the isopropyl alcohol is evaporated from the front and rear surfaces of the wafer whereby drying the wafer.

According to a seventh aspect of the present invention, there is provided a wafer drying method as defined in the sixth aspect, wherein the isopropyl alcohol of liquid phase is jetted at a temperature at least 5° C. higher than the temperature of the wafer in the vicinity of the jetting opening of the nitrogen gas to spray the isopropyl alcohol of mist-form into the space.

According to an eighth aspect of the present invention, there is provided a wafer drying method as defined in the sixth or seventh aspect, wherein the wafer is of an ordinary temperature and the temperature of the mist is generally not less than 30° C.

According to a ninth aspect of the present invention, there is provided a wafer drying method as defined in any one of the sixth through eighth aspects, wherein the isopropyl alcohol of mist-form is of such a state that the isopropyl alcohol per se is suspended alone in the nitrogen gas.

According to a tenth aspect of the present invention, there is provided a wafer drying method as defined in any one of the sixth through ninth aspects, wherein the isopropyl alcohol is sprayed in mist-form at a temperature 5° C. to 60° C. higher than the temperature of the wafer.

According to an eleventh aspect of the present invention, there is provided a wafer drying apparatus as defined in any one of the first through fifth aspects, wherein the mist spraying device includes a first jetting hole for jetting the nitrogen gas, and a second jetting hole disposed adjacent to the first jetting hole, for jetting the isopropyl alcohol of liquid-phase, whereby simultaneously with nitrogen gas jetting from the first jetting hole, the isopropyl alcohol of liquid-phase is jetted from the second jetting hole, thereby spraying the isopropyl alcohol of mist-form in the space.

According to a twelfth aspect of the present invention, there is provided a wafer drying apparatus as defined in any one of the first through fifth aspects, wherein the mist spraying device includes: a first passage for supplying the nitrogen gas to a rectangular parallelopiped porous fluoroplastic body having high water repellency; and a second passage provided nearer to a wafer-facing side of the body than the first passage, for supplying the isopropyl alcohol of liquid-phase. In the mist spraying device, simultaneously with the nitrogen gas being supplied to the first passage, the isopropyl alcohol of liquid phase is supplied to the second passage, whereby the nitrogen gas and the isopropyl alcohol of liquid phase are jetted together from wafer-facing surfaces of the rectangular parallelopiped porous body, thereby spraying the mist-form isopropyl alcohol into the space.

According to a thirteenth aspect of the present invention, there is provided a wafer drying apparatus as defined in any one of the first through fifth, eleventh, and twelfth aspects, wherein the nitrogen gas is jetted at a temperature equal to the temperature of the wafer or a temperature higher than the temperature of the wafer within a temperature range of up to 60° C.

According to a fourteenth aspect of the present invention, there is provided a wafer drying apparatus as defined in any one of the first through fifth, eleventh, and twelfth aspects, wherein the nitrogen gas is jetted at a temperature higher than the temperature of the wafer within a range of 5° C. to 60° C.

According to a fifteenth aspect of the present invention, there is provided a wafer drying method as defined in any one of the sixth through tenth aspects wherein the nitrogen gas is jetted at a temperature equal to the temperature of the wafer or a temperature higher than the temperature of the wafer within a temperature range of up to 60° C.

According to a sixteenth aspect of the present invention, there is provided a wafer drying method as defined in any one of the sixth through tenth aspects, wherein the nitrogen gas is jetted at a temperature higher than the temperature of the wafer within a range of 5° C. to 60° C.

According to another aspect of the present invention, there is provided the wafer drying apparatus set forth in any one of the first through fifth aspects and the eleventh through fourteenth aspects. In this aspect, the mist spraying device is not intended to mist the IPA of liquid phase by electrical energy such as a supersonic wave, but is capable of jetting nitrogen gas into the space above the liquid level of the pure water in the drying chamber without using electrical energy and, simultaneously therewith, jetting isopropyl alcohol of liquid phase into aforesaid space at a temperature higher than the temperature of the wafer and in the vicinity of a jetting opening for the nitrogen gas so that isopropyl alcohol of mist-form is sprayed into the space.

According to another aspect of the present invention, there is provided the wafer drying apparatus set forth in any one of the preceding aspects set forth herein above. In this aspect, the mist spraying device is provided in pair in such a way that the pair of mist spraying devices is arranged in opposed relation facing downward in the space above the liquid level of the pure water within the drying chamber in such a way that the isopropyl alcohol of mist-form is sprayed into the space from lateral directions. Alternatively, the mist spraying device is provided in pair in such a way that the pair of mist spraying devices is so arranged that in the space above the liquid level of the pure water in the drying chamber the isopropyl alcohol of mist-form is sprayed downwardly toward the liquid level of the pure water.

According to a further aspect of the present invention, there is provided the wafer drying method set forth in any one of the sixth through tenth aspects and the fifteenth and sixteenth aspects. In this aspect, the mist spraying is not intended to mist IPA of liquid phase by electrical energy such as a supersonic wave for spraying the mist, but is intended to jet nitrogen gas into the space above the liquid level of the pure water in the drying chamber and, simultaneously therewith, to jet isopropyl alcohol of liquid phase into aforesaid space at a temperature higher than the temperature of the wafer and in the vicinity of the jetting opening for the nitrogen gas, without using electrical energy, so that the isopropyl alcohol of mist-form is sprayed into the space.

According to a still further aspect of the present invention, there is provided the wafer drying method set forth in any one of the preceding aspects, for the purpose of spraying the mist, the isopropyl alcohol of mist form is sprayed from opposite sides in the space on the liquid level of the pure water in the drying chamber, or the isopropyl alcohol of mist form is sprayed downwardly toward the liquid level of the pure water in the space above the liquid level in the drying chamber.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Before the description of the present invention proceeds, it is to be noted that like parts are designated by like reference numerals throughout the accompanying drawings.

Figure 1:
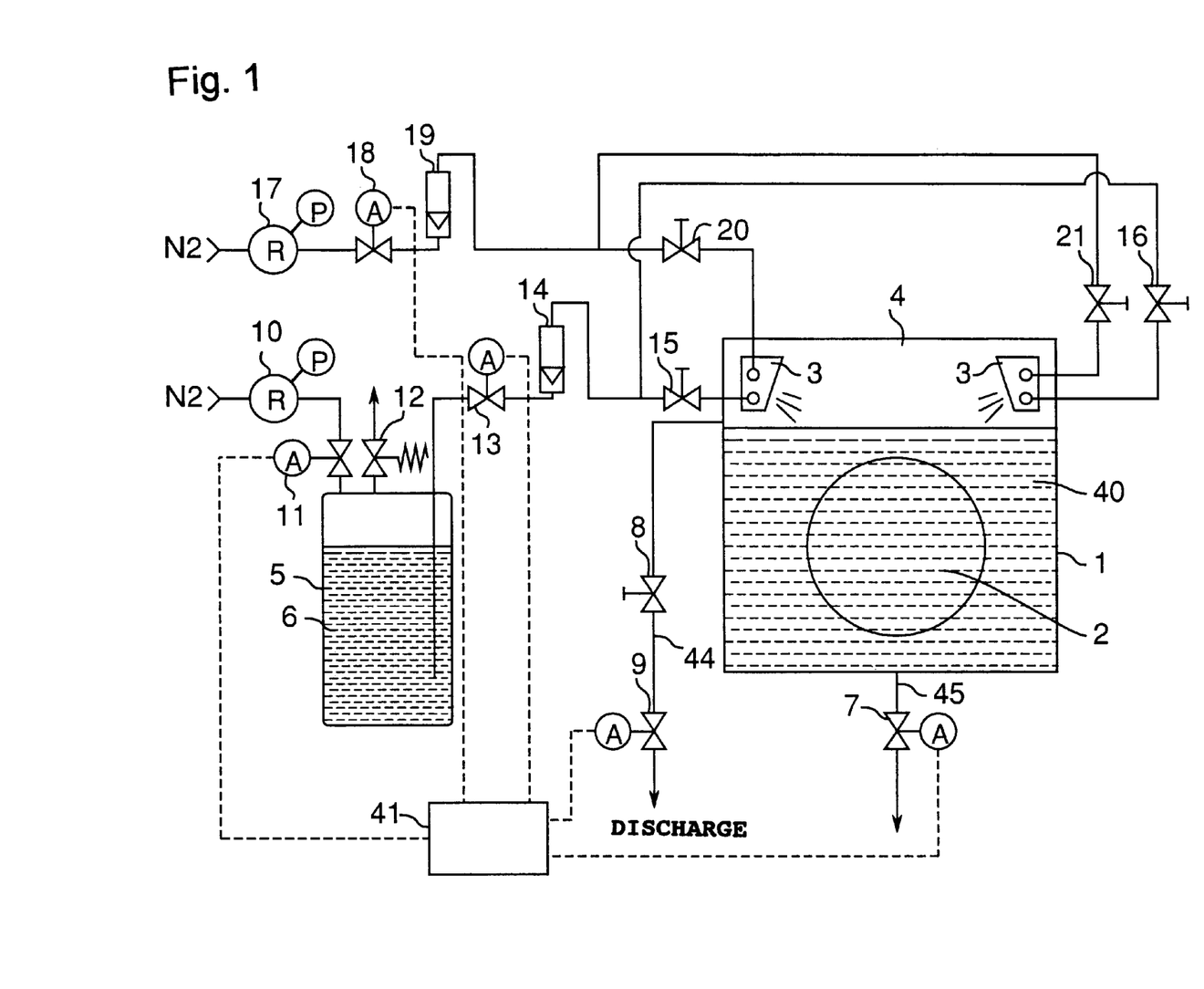
FIG. 1 is a schematic structural view of a wafer drying apparatus according to a first embodiment of the present invention.

The wafer drying apparatus of the first embodiment of the present invention, as shown in FIG. 1, includes: a drying chamber 1 which is capable of immersing wafers 2 in pure water 40 for cleaning the wafers 2 supported by a known carrier not shown, cleaning the wafers 2, and thereafter drying the wafers 2 therein; and mist spraying devices 3 which jet nitrogen gas into a space 4 above the liquid level of the pure water 40 in the drying chamber 1. Simultaneously therewith, the mist spraying devices 3 jet an isopropyl alcohol of liquid phase (hereinafter referred to as IPA) at a temperature higher than the temperature of the wafer 2 (higher than, for example, ordinary temperature), preferably at least 5° C. higher than the temperature of the wafer 2, more preferably higher than the temperature of the wafer 2 within the range of 5° C. to 60° C., thereby to spray IPA of mist-form above the space 4. Thus, when the wafers 2 are exposed above liquid level in the drying chamber 1 by discharging the pure water 40 in the drying chamber 1 therefrom or by elevating the wafers 2 in the drying chamber 1, IPA is sprayed continuously from mist spraying devices 3, 3 to the front and rear surfaces of each wafer 2 in such a condition that the IPA per se is suspended alone in the nitrogen gas without nitrogen as a carrier so that the pure water held on the front and rear sides of each wafer 2 is replaced by the IPA of the mist-form.

Figure 2A:
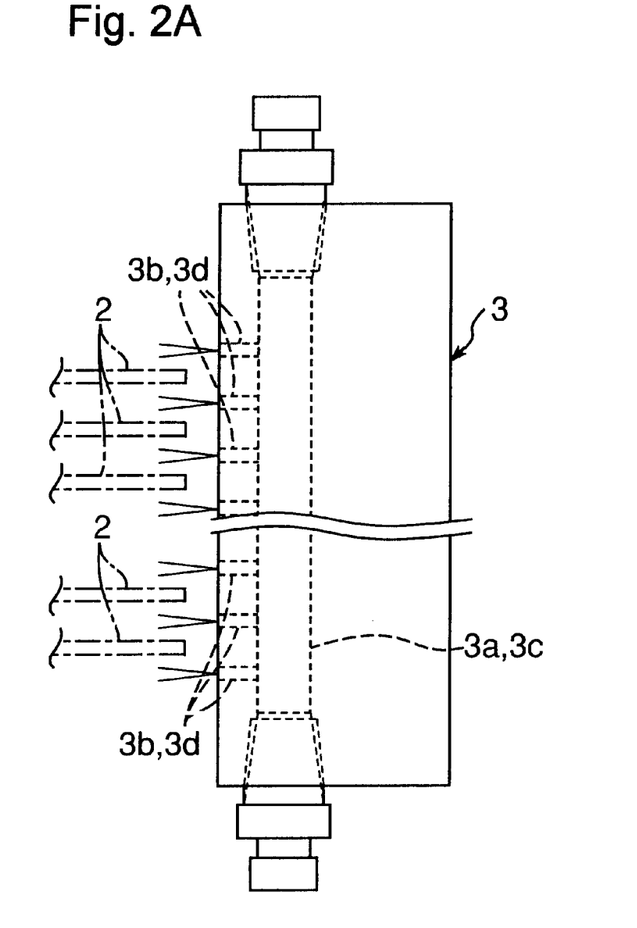
FIGS. 2A and 2B are respectively a plan view and a sectional view of the mist spraying device of the wafer drying apparatus in FIG. 1.
Figure 2B:
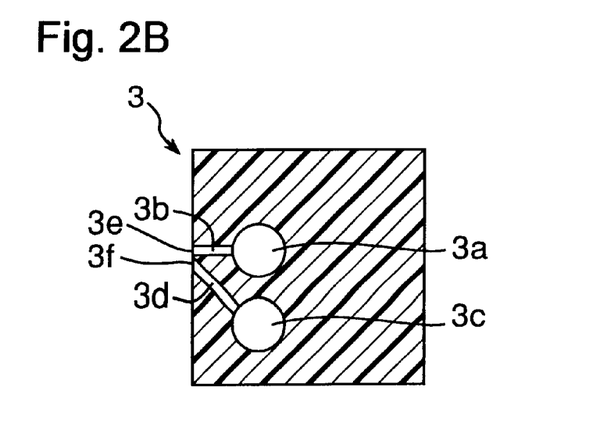

The mist spraying devices 3, as shown in FIGS. 2A and 2B, respectively include: a nitrogen gas passage 3a and a liquid phase IPA passage 3c, both longitudinally extending along and through a fluororesin made rectangular parallelopiped body; a multiplicity of narrow nitrogen gas jetting passages 3b extending from the nitrogen gas passage 3a and having jetting holes 3e each open approximately toward the wafers 2 (specifically, toward a space between adjacent wafers 2, 2 and a position corresponding to the center of the wafer 2); and a multiplicity of narrow IPA jetting passages 3d extending from the liquid phase IPA passage 3c and having jetting holes 3f open toward the jetting holes 3e at the open ends of the nitrogen gas jetting passages 3b. Therefore, simultaneously with the jetting of nitrogen gas from the jetting holes 3e of the nitrogen gas jetting passages 3b, IPA of liquid phase can be jetted from the jetting holes 3f of the IPA jetting passages 3d, so that IPA of mist-form can be sprayed into the space 4. The jetting hole 3e of the nitrogen gas jetting passage 3b and the jetting hole 3f of the IPA jetting passage 3d constitute one set of mist spraying nozzles, and each set of mist spraying nozzles is disposed in opposed relation in a space between adjacent wafers 2, 2 of those arranged at predetermined intervals, for example, of the order of 50 wafers. Outside the wafers 2 in the drying chamber 1, at opposite sides, the mist spraying nozzles are disposed, whereby mist-form of IPA can be sprayed from the mist spraying nozzles to opposite sides, front and rear, of all wafers 2.

Meanwhile, the nitrogen gas is supplied at an ordinary temperature or at the temperature of wafer 2, or at a temperature higher than the ordinary temperature (for example, a temperature higher than the ordinary temperature or the wafer 2 temperature within a temperature range of up to 60° C.), preferably at least 5° C. higher than the ordinary temperature or the temperature of the wafer 2. More preferably, it is supplied at a temperature higher than the ordinary temperature or the temperature of the wafer 2 within a range of 5° C. to 60° C., which gas is supplied to the mist spraying devices 3, 3 disposed at opposite sides in FIG. 1 through a pressure reducing valve 17, a first air operated valve 18, a flow meter 19, and manually operated valves 20, 21. It is desirable that the first air operated valve 18 automatically adjusts the flow rate of the nitrogen gas on the basis of the flow rate of the nitrogen gas detected by the flow meter 19. The manually operated valves 20, 21, respectively disposed at the mist spraying devices 3, 3, left and right, can adjust automatically the balance of the mist spray, left and right, by manually adjusting open and close the manually operated valves 20, 21 when spraying the mist into the space 4 on the level surface of the pure water 40. As a result of such adjustment, the mist is sprayed at a temperature higher than the ordinary temperature or the temperature of the wafer 2, preferably at least 5° C. higher than the ordinary temperature or the temperature of the wafer 2, more preferably higher than the ordinary temperature or the temperature of the wafer 2 within a temperature range of from 5° C. and up to 60° C. It is noted in this connection that when nitrogen gas is supplied to each of the mist spraying devices 3, 3, the nitrogen gas may be supplied unidirectionally into the nitrogen gas passage 3a from one end side of the mist spraying device 3 toward the closed other end side. Such arrangement has an advantage of simplicity of construction. However, within the nitrogen gas passage 3a,
there may occur pressure loss and this may not allow uniform jetting of the nitrogen gas from the jetting holes 3e of all nitrogen gas jetting passages 3b, in which case the nitrogen gas may be simultaneously supplied from both the one end side and the other end side of each mist spraying device 3 into the nitrogen gas passage 3a and toward an intermediate portion thereof between the both end sides, whereby pressure loss within the nitrogen gas passage 3a can be prevented, so that the nitrogen gas can be uniformly jetted from the jetting holes 3e.

As for IPA, nitrogen gas is supplied into an IPA pressurized-supply tank 5 via a pressure reducing valve 10 and a second air operated valve 11, separately from the aforesaid nitrogen gas, and IPA liquid 6 in the pressurized-IPA supply tank 5 is supplied under the pressure of the separately-supplied nitrogen gas to each of the mist spraying devices 3, 3 disposed at left and right sides in FIG. 1 through a third air-operated valve 13, a flow meter 14, and manually operated valves 15, 16. Numeral 12 denotes a relief valve for the pressurized-IPA supply tank. Preferably, the third air-operated valve 13 automatically adjusts the flow rate of the liquid of the IPA on the basis of the flow rate of the IPA liquid detected by the flow meter 14. The manually operated valves 15, 16 are disposed at the respective mist spraying devices 3, 3, left and right, and can adjust the balance of mist spraying, left and right, by adjusting open and close the manually operated valves 15, 16 when mist is sprayed from the mist spraying devices 3, 3, left and light, into the space 4 on the level surface of the pure liquid 40 in the drying chamber 1. For supplying the IPA liquid to each of the mist spraying devices 3, 3, the IPA liquid is supplied into the IPA passage 3c from the first end side of each mist spraying device 3 unidirectionally toward the closed second side thereof. Such arrangement has an advantage of simplicity of construction. However, in case that pressure loss should occur in the IPA passage 3c and that IPA liquid can not be uniformly jetted from all of the jetting holes 3f of the IPA jetting passages 3d to uniformly spray IPA mist, IPA liquid is simultaneously supplied into the IPA passage 3c toward an intermediate portion thereof between the first end side and the second end side of each mist spraying device 3 from both of the first end side and the second end side of each mist spraying device 3, whereby pressure loss within the IPA passage 3c can be prevented so that the IPA liquid can be uniformly jetted from the jetting holes 3f for uniform IPA mist spraying.

In order to prevent abnormal increase of pressure in the space 4 on the liquid level of the pure water 40 in the drying chamber 1, there is provided a discharge passage 44, with the provision of a manually operated valve 8 for adjusting a discharge flow rate thereof, and a fourth air operated valve 9 for carrying out discharge start or stop thereof. A pressure sensor is disposed in the space 4 so that the fourth air operated valve 9 can be opened and closed automatically according to the pressure in the space 4 detected by the pressure sensor.

Further, a discharge passage 45 for discharging pure water 40 is provided at the bottom of the drying chamber 1 and a fifth air operated valve 7 is provided in the discharge passage 45 for adjusting its discharge flow rate thereof.

The first air operated valve 18, the second air operated valve 11, the third air operated valve 13, the fourth air operated valve 9, and the fifth air operated valve 7 are connected to a control device 41 so that respective flow rates of the nitrogen gas and the IPA liquid to be supplied into the drying chamber 1, that is, spray condition of IPA mist, quantity of exhaust gas from the space 4 within the drying chamber 1, quantity of discharge of the pure water 40, etc. are automatically motion-controlled according to a predetermined program.

According to the above described arrangement, when the pure water 40 is supplied into the drying chamber 1 in the closed condition of the exhaust passage 44 and then the wafers 2 are immersed in the pure water 40 supplied, the nitrogen gas is jetted from the mist spraying devices 3, 3. Simultaneously therewith, the IPA liquid is jetted in the vicinity of the jet openings for the nitrogen gas so that the mist of the IPA is sprayed into the space 4 at about 2 cc/min., for example. The direction in which the mist is sprayed is, preferably, a direction oriented slightly downward and approximately toward the wafers 2 in the pure water 40 (specifically, a space between adjacent wafers 2, 2 and oriented toward a position corresponding to the center of the wafer) so that the mist is uniformly held on the liquid level of the pure water 40. In this case, if the pressure in the space 4 of the drying chamber becomes abnormally high, preferably, discharge passage 44 is opened to reduce the pressure.

In this way, in order that an area in the vicinity of the liquid level of the pure water 40 in the space 4 can maintain the condition of the area being covered with the IPA mist, the mist spraying is continued. In that condition the fifth air operated valve 7 is opened to start discharging the pure water 40 gradually from the drying chamber 1 under the control of the control device 41. By way of example of the discharge rate, when the mist is jetted at about 2 cc/min for spraying, for example, the discharge rate may be such that the liquid level of the pure water 40 is lowered about 2 mm per sec.

As a result, the upper portions of the wafers 2 will be exposed above the pure water 40, but without natural oxidization upon contact of the wafer surfaces with oxygen, the IPA mist which continues to be uniformly sprayed above the liquid level of the pure water 40 is promptly replaced by the pure water 40 held on the both surfaces, front and rear surfaces of the wafers 2. In case that the temperature of the IPA mist is higher than the temperature of the wafers 2, that is, higher than the ordinary temperature (for example, the temperature of wafers 2, i.e., higher than the ordinary temperature within the range of up to 60° C.), preferably at least equal to or more than 5° C. higher, more preferably higher within the range of from 5° C. to 60° C., the drying is promptly performed. Subsequently, the IPA is naturally evaporated from the both surfaces, front and rear surfaces of the wafers 2, whereby the both front and rear surfaces of the wafers 2 are dried.

In addition, when the temperature of the wafers 2 is the ordinary temperature, the temperature of the IPA, or the nitrogen gas, or the IPA and the nitrogen gas may be made higher than the ordinary temperature by an extent within a range of from 5° C. to 60° C., and an IPA mist of a temperature higher than the ordinary temperature may be sprayed to the wafers 2, in which case more prompt drying can be achieved. For example, 50 wafers can be dried in not more than 10 minutes.

According to the first embodiment, the IPA mist is constantly retained above the liquid level of the pure water in which the wafer 2 are immersed, so that upper portions of the wafers 2 are exposed from the liquid level of the pure water 40. However, the IPA mist that is uniformly supplied to the liquid level of the pure water 40 is promptly replaced by the pure water held on both front and rear surfaces of the wafers 2, without natural oxidization of the wafer surfaces due to contact with oxygen. Also, if the temperature of the IPA is made higher than the temperature of the wafers 2, that is, higher than the ordinary temperature, preferably at least 5° C. or more higher, more preferably higher by a range of 5° C. to 60° C., then the IPA can readily cohere to the both, front and rear surfaces, of the wafers 2, so that the IPA becomes more likely to be replaced by the pure water held on the both front and rear surfaces of the wafers 2, and both front and rear surfaces of the wafers 2 are promptly dried. Therefore, as compared with the conventional method in which after the pure water on the surfaces of wafers at the ordinary temperature is replaced by IPA of the ordinary temperature, the IPA of the ordinary temperature is dried, drying time is reduced and drying efficiency can be enhanced. Further, since the IPA is sprayed in a mist condition on the liquid level of the pure water 40, the consumption of the IPA can be substantially reduced as compared with conventional practice in which IPA is supplied in the form of vapor. When the IPA is supplied in the form of vapor, it is necessary to cover the exterior of the piping with heat insulating material in order to maintain the vapor condition. However, in the first embodiment, it is only required to supply the liquid-phase IPA of the ordinary temperature to the right-and-left mist spraying devices 3, 3, respectively, so that the piping does not need to be covered with heat insulating material, allowing the wafer drying apparatus to be simple. Also, whereas energy for heating would be necessitated in the case of vaporizing the IPA, the energy that allows the nitrogen gas and the IPA to be jetted off from the mist spraying device 3 is only required in the first embodiment, so that the IPA mist can be formed with low-priced, simple apparatus constitution. Like this, the liquid-phase IPA can be jetted while the nitrogen gas is jetted, in mutually opposite side ways, by which the IPA mist can be filled into the space of the drying chamber so that the IPA mist sprayed onto both the front and rear surfaces of the wafers, and that the IPA mist can be supplied all over the both front and rear surfaces of the wafers.

Further, liquid phase IPA can be formed into mist not by using electrical energy such as ultrasonic waves, but by jetting IPA from the IPA spray nozzle near the jetting hole for the nitrogen gas without using any electrical energy. Therefore, the spraying operation of the IPA mist can be carried out more safely and more stably for highly flammable IPA.

In addition, the present invention is not limited to the first embodiment, and may be embodied in various ways.

Figure 3A:
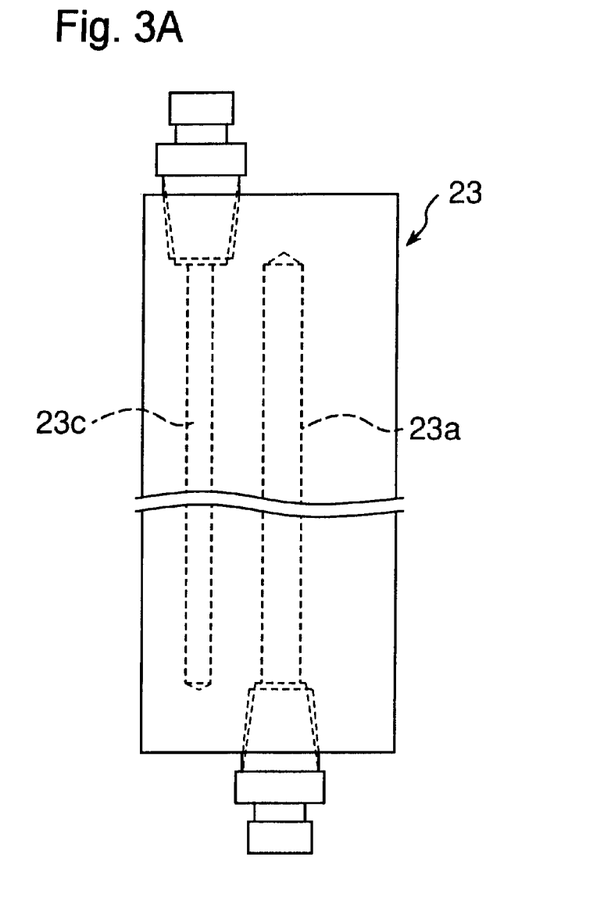
FIGS. 3A and 3B are respectively a plan view and a sectional view of the mist spraying device of the wafer drying apparatus according to a modification of the embodiment.
Figure 3B:
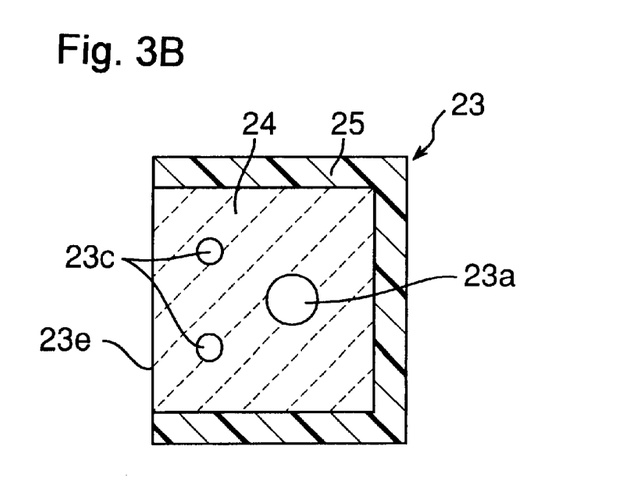

For example, the mist spraying device 3 is not limited to that of FIGS. 2A and 2B, and may be such a mist spraying device 23 as shown in FIGS. 3A and 3B. In FIGS. 3A and 3B, one nitrogen gas passage 23a and two IPA passages 23c, 23c are formed longitudinally with respect to a rectangular parallelopiped main body 24 made of porous fluorores in. Surfaces of the rectangular parallelopiped main body 24 except its surface opposed to the wafers 2 are covered with a covering member 25 made of non-porous ordinary fluororesin, thereby preventing nitrogen gas and IPA from going out of the surfaces covered with the covering member 25. Because of the porous property of the rectangular parallelopiped main body 24, in a jetting surface 23e which is not covered with the covering member 25, when nitrogen gas is jetted from the nitrogen gas passage 23a located close to the surface on one side opposite to the jetting surface 23e at the jetting surface 23e, IPA liquid is jetted toward the jetting surface 23e also from IPA passages 23c, 23c located close to the jetting surface 23e more than the nitrogen gas passage 23a. Thus, mist can be sprayed almost as the mist can be sprayed in FIGS. 2A and 2B. In this example, mist is not sprayed in specified intervals, but can be sprayed from generally all over the jetting surface 23e opposite to the wafers 2. In addition, for the supplying of nitrogen gas and IPA liquid to the right and left mist spraying devices 3, 3, it is appropriate to respectively supply the nitrogen gas and the IPA liquid into the nitrogen gas passage 23a and the IPA passages 23c in one way from a first-end side toward the second-end closed portion, and from the second side to the first-end side closed portion, of each mist spraying device 3. In such a case, there is provided an advantage of simplified construction. However, there occur pressure losses within the nitrogen gas passage 23a and the IPA passages 23c, respectively, so that the nitrogen gas and the IPA liquid cannot be sprayed uniformly from all the nitrogen gas passage 23a and the IPA passages 23c. In these cases, it becomes possible to prevent pressure losses within the nitrogen gas passage 23a and the IPA passages 23c and to uniformly spray nitrogen gas and IPA liquid, by forming the nitrogen gas passage 23a and the IPA passages 23c longitudinally penetrating the rectangular parallelopiped main body 24, and by supplying nitrogen gas and IPA liquid into the nitrogen gas passage 23a and the IPA passages 23c simultaneously from both the first-end side and the second-end side of each mist spraying device 3.

According to this embodiment, in addition to the functional effects of the foregoing embodiment, because the rectangular parallelopiped main body 24 is made from porous fluororesin, the rectangular parallelopiped main body 24 is so strong in water-repelling property as to prevent pure water, if immersed therein, from penetrating inside, so that unmisted liquid phase IPA and pure water serving as cleaning water in the drying chamber 1 never mix together. Further, by virtue of the overall porous property, the main body 24 allows mist to be sprayed from the generally overall surface of the jetting surface 23e opposed to the wafers 2, so that the mist can be sprayed even more uniformly to the wafers 2.

Figure 4:
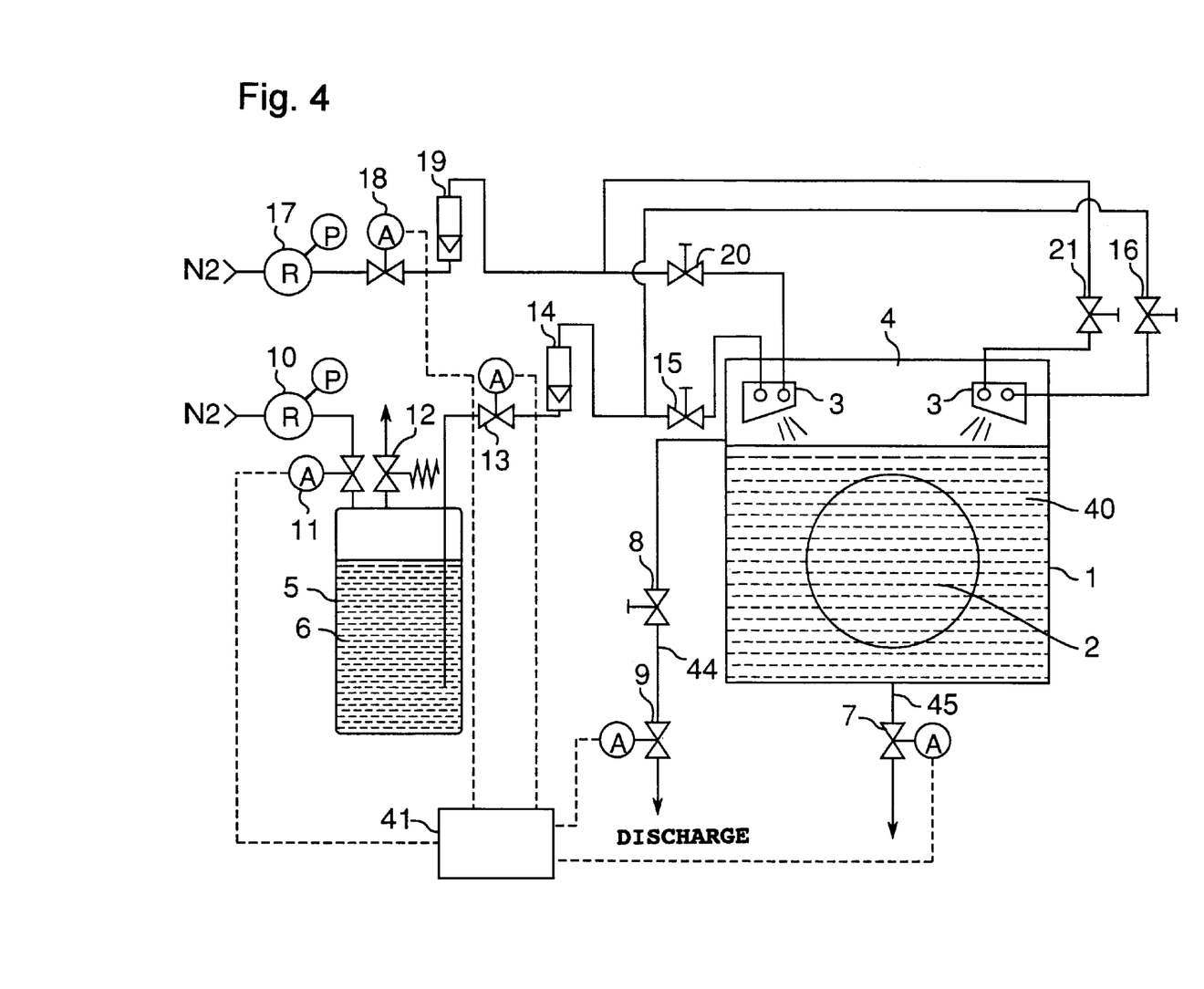
FIG. 4 is a schematic structural view of a wafer drying apparatus of a second embodiment of the present invention.

Also, as in the first embodiment, each mist spraying device 3 is not limited to one which jets the mist sideways in the space 4 above the liquid level of the pure water 40 in the drying chamber 1 as shown in FIG. 1, and may be another which jets the mist downward as shown in FIG. 4 as a second embodiment of the present invention. The other constitution is the same as in the second embodiment and omitted in description.

With such a constitution, liquid-phase IPA can be jetted simultaneously while nitrogen gas is jetted downward, so that IPA mist can be sprayed to both front-and-rear surfaces of the wafers, from above to below, and that IPA mist can be supplied to the entirety of both front-and-rear surfaces of the wafers.

Further, instead of discharging the pure water 40 from the drying chamber 1, the wafers 2 may be exposed above liquid level of the pure water 40 in the drying chamber 1, by elevating the wafers 2 within the drying chamber 1.

According to the present invention, since IPA is constantly retained as suspended alone in nitrogen gas, without taking IPA mist, i.e. nitrogen, as a carrier, above the liquid level of pure water in which the wafers are immersed, upper portions of the wafers would be exposed above the pure water. However, the IPA mist that is uniformly supplied to the liquid level of the pure water is promptly replaced with the pure water held on both front and rear surfaces of the wafers, without natural oxidization of the wafer surfaces due to contact with oxygen. Besides, when the temperature of IPA mist is made higher than the temperature of the wafers, that is, higher than the ordinary temperature, preferably at least 5° C. or more higher, more preferably higher by the range of 5° C. to 60° C., IPA can readily cohere to both the front and rear surfaces of the wafers, thus being more likely to be promptly replaced with the pure water held on both front-and-rear surfaces of the wafers, and the front-and-rear surfaces of the wafers are promptly dried.

Therefore, as compared with the conventional method in which after the pure water on the surfaces of wafers of the ordinary temperature is replaced with IPA of the ordinary temperature, the IPA of the ordinary temperature is dried, drying time is reduced and drying efficiency can be enhanced. Further, as compared with conventional practice in which IPA is supplied in the form of vapor, since the IPA is sprayed in a mist condition on the liquid level of pure water, the consumption of the IPA can be substantially reduced. When IPA is supplied in the form of vapor, it is necessary to cover the exterior of the piping with heat insulating material in order to maintain the vapor condition. However, according to the wafer drying apparatus of the present invention, it is only required to supply the liquid-phase IPA of the ordinary temperature to the mist spraying devices, respectively, so that the piping does not need to be covered with heat insulating material, allowing the apparatus to be simple. Also, whereas energy for heating would be necessitated in the case of vaporizing the IPA, only the energy that allows nitrogen gas and IPA to be jetted is required in the present invention, so that the IPA mist can be formed with low-priced, simple apparatus constitution.

Also, when the rectangular parallelopiped main body of the mist spraying device is made from porous fluororesin, the rectangular parallelopiped main body is so strong in water-repelling property as to prevent pure water, if immersed therein, from penetrating inside, so that unmisted liquid phase IPA and pure water serving as cleaning water in the drying chamber 1 never mix together. Further, by virtue of the overall porous property, the main body allows mist to be sprayed from the generally overall surface of the jetting surface opposed to the wafers, so that the mist can be sprayed even more uniformly on the wafers.

Further, the liquid phase IPA can be formed into mist not by using electrical energy such as ultrasonic waves, but by spraying the IPA from the IPA spray nozzles near the jetting holes for the nitrogen gas without using any electrical energy. Therefore, spraying operation of the IPA mist can be carried out more safely and more stably for highly flammable IPA.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:
1. A wafer drying apparatus comprising:
   a drying chamber capable of immersing a wafer in pure water; and
   a mist spraying device for jetting nitrogen gas into a space on a liquid level of the pure water in the drying chamber and, simultaneously with the jetting of the nitrogen gas, injecting isopropyl alcohol of liquid-phase into the space at a temperature higher than a temperature of the wafer and in the vicinity of an opening for jetting the nitrogen gas, whereby isopropyl alcohol of mist-form is sprayed in the space, wherein when the wafer is exposed above the liquid level of the pure water in the drying chamber by discharging the pure water in the drying chamber from the drying chamber or elevating the wafer in the drying chamber, the pure water held on front and rear surfaces of the wafer is replaced by the isopropyl alcohol of mist-form, and then the isopropyl alcohol is evaporated from the front and rear surfaces of the wafer such that the wafer is dried.

2. The wafer drying apparatus as defined in claim 1, wherein the mist spraying device is adapted to inject the isopropyl alcohol of the liquid phase at a temperature at least 5° C. higher than the temperature of the wafer in the vicinity of the nitrogen gas injection opening so that the isopropyl alcohol of mist-form is sprayed into the space.

3. The wafer drying apparatus as defined in claim 1, wherein the wafer is an ordinary temperature and the temperature of the mist is not less than 30° C.

4. The wafer drying apparatus as defined in claim 1, wherein the isopropyl alcohol of mist-form is in such a state that only the isopropyl alcohol per se is suspended in the nitrogen gas.

5. The wafer drying apparatus as defined in claim 1, wherein the mist spraying device is adapted to spray the isopropyl alcohol in mist-form at a temperature 5° C. to 60° C. higher than the temperature of the wafer.

6. A wafer drying method comprising:

immersing a wafer in pure water in a drying chamber;

jetting nitrogen gas into a space at a liquid level of the pure water in the drying chamber, and spraying isopropyl alcohol of liquid phase at a temperature higher than a temperature of the wafer and in the vicinity of an opening for jetting the nitrogen gas simultaneously with the jetting of the nitrogen gas, whereby isopropyl alcohol of mist-form is sprayed in the space; and when the wafer is exposed above the liquid level of the pure water in the drying chamber by discharging the pure water in the drying chamber from the drying chamber or by elevating the wafer in the drying chamber, replacing the pure water held on front and rear surfaces of the wafer with the isopropyl alcohol of mist-form, and then evaporating the isopropyl alcohol from the front and rear surfaces of the wafer such that the wafer is dried.

7. The wafer drying method as defined in claim 6, wherein the isopropyl alcohol of liquid phase is jetted at a temperature at least 5° C. higher than the temperature of the wafer in the vicinity of the jetting opening of the nitrogen gas to spray the isopropyl alcohol of mist-form into the space.

8. The wafer drying method as defined in claim 6, wherein the wafer is an ordinary temperature and the temperature of the mist is not less than 30° C.

9. The wafer drying method as defined in claim 6, wherein the isopropyl alcohol of mist-form is in such a state that only the isopropyl alcohol per se is suspended in the nitrogen gas.

10. The wafer drying method as defined in claim 6, wherein the isopropyl alcohol is sprayed in mist-form at a temperature 5° C. to 60° C. higher than the temperature of the wafer.

11. The wafer drying apparatus as defined in claim 1, wherein the mist spraying device includes a first jetting hole for jetting the nitrogen gas, and a second jetting hole disposed adjacent to the first jetting hole for jetting the isopropyl alcohol of liquid-phase, wherein the mist spraying device is adapted to simultaneously jet nitrogen gas from the first jetting hole and jet the isopropyl alcohol of liquid-phase from the second jetting hole, thereby spraying the isopropyl alcohol of mist-form in the space.

12. The wafer drying apparatus as defined in claim 1, wherein the mist spraying device includes:

a first passage for supplying the nitrogen gas to a rectangular parallelopiped porous fluoroplastic body having high water repellency; and a second passage for supplying the isopropyl alcohol of liquid-phase, the second passage being provided nearer to a wafer-facing side of the body than the first passage, and wherein the mist spraying device is adapted to simultaneously supply the nitrogen gas to the first passage and supply the isopropyl alcohol of liquid phase to the second passage, whereby the nitrogen gas and the isopropyl alcohol of liquid phase are jetted together from wafer-facing surfaces of the rectangular parallelopiped porous body, thereby spraying the mist-form isopropyl alcohol into the space.

13. The wafer drying apparatus as defined in claim 1, wherein the mist spraying device is adapted to jet the nitrogen gas at a temperature equal to the temperature of the wafer or a temperature higher than the temperature of the wafer within a temperature range of up to 60° C.

14. The wafer drying apparatus as defined in claim 1, wherein the mist spraying device is adapted to jet the nitrogen gas at a temperature higher than the temperature of the wafer within a range of 5° C. to 60° C.

15. The wafer drying method as defined in claim 6, wherein the nitrogen gas is jetted at a temperature equal to the temperature of the wafer or at a temperature higher than the temperature of the wafer within a temperature range of up to 60° C.

16. The wafer drying method as defined in claim 6, wherein the nitrogen gas is jetted at a temperature higher than the temperature of the wafer within a range of 5° C. to 60° C.

* * * * *